(12) United States Patent
Varanasi

(10) Patent No.: US 8,780,659 B2
(45) Date of Patent: Jul. 15, 2014

(54) PROGRAMMING MEMORY CELLS

(75) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 442 days.

(21) Appl. No.: 13/106,118

(22) Filed: May 12, 2011

(65) Prior Publication Data

US 2012/0287718 A1 Nov. 15, 2012

(51) Int. Cl.
*G11C 16/10* (2006.01)

(52) U.S. Cl.
USPC ...... 365/206; 365/189.16; 365/244; 714/792; 714/795

(58) Field of Classification Search
USPC ............... 365/189.16, 206, 244, 185.09, 184; 714/792, 795, 702
See application file for complete search history.

(56) References Cited

U.S. PATENT DOCUMENTS

| | | |
|---|---|---|
| 2007/0171714 A1* | 7/2007 | Wu et al. ................. 365/185.09 |
| 2007/0171730 A1 | 7/2007 | Ramamoorthy et al. |
| 2009/0013233 A1 | 1/2009 | Radke |
| 2009/0129153 A1 | 5/2009 | Sarin et al. |
| 2009/0129169 A1 | 5/2009 | Roohparvar et al. |
| 2009/0132755 A1 | 5/2009 | Radke |
| 2009/0204746 A1 | 8/2009 | Chen et al. |
| 2010/0042773 A1 | 2/2010 | Yeh |

FOREIGN PATENT DOCUMENTS

| | | |
|---|---|---|
| KR | 20080048534 A | 6/2008 |
| KR | 10-2009-0110648 | 10/2009 |
| WO | WO 2010/002941 A1 | 1/2010 |
| WO | WO 2010/092536 A1 | 8/2010 |

* cited by examiner

*Primary Examiner* — Huan Hoang
*Assistant Examiner* — Jay Radke
(74) *Attorney, Agent, or Firm* — Dicke, Billig & Czaja, PLLC

(57) ABSTRACT

Methods for programming, memory devices, and methods for reading are disclosed. One such method for programming a memory device (e.g., an SLC memory device) includes encoding a two level data stream to a three level stream prior to programming the memory.

31 Claims, 5 Drawing Sheets

$U_K$:   1   0   0   1   0   1   0   1   1   ...

$V_K$:   1   1   1   0   0   1   1   0   1   ...

$C_K$:  -1  -1  -1   1   1  -1  -1   1  -1   ...

$X_K$:   0  -2  -2   0   2   0  -2   0   0   ...

K ⟶

PROGRAMMING MEMORY CELLS

TECHNICAL FIELD

The present embodiments relate generally to memory and a particular embodiment relates to programming and reading memory cells.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on a block-by-block basis instead of one byte at a time. A threshold voltage of each of the memory cells determines a data value stored in each memory cell.

FIGS. 1A and 1B illustrate possible program states of typical non-volatile memory cells. FIG. 1A illustrates the possible program states of a single level cell (SLC) memory device. FIG. 1B illustrates the possible program states of a multiple level cell (MLC) memory device.

Each of the distributions in FIGS. 1A and 1B represent a threshold voltage ($V_t$) range with the number of memory cells at each threshold voltage within that particular range. Each distribution represents a particular programmable state. For example, FIG. 1A shows that the negative voltage distribution 101 represents a logical "1" state (e.g., erased state) and the positive voltage distribution 102 represents a logical "0" state (e.g., programmed state). Similarly, FIG. 1B shows that the negative voltage distribution 103 represents a logical "11" state (e.g., erased state) and the three positive voltage distributions 104-106 represent logical "10", "00", and "01" states (e.g., programmed states), respectively.

Due, at least in part, to the relatively low threshold voltages used in non-volatile memory devices, programming a memory device can be susceptible to noise. For example, referring to FIG. 1A, if −A is a voltage representing an erased state and +A is a voltage representing the programmed state, A might be in a range of 1V to 3V. Thus, noise that occurs during either programming or reading the voltages might cause the data state of the memory cell to be incorrectly programmed or incorrectly read.

For the reasons stated above and for other reasons that will become apparent to those skilled in the art upon reading and understanding the present specification, there is a need in the art for reducing the effects of noise in a memory device.

DETAILED DESCRIPTION

Figure 1A:
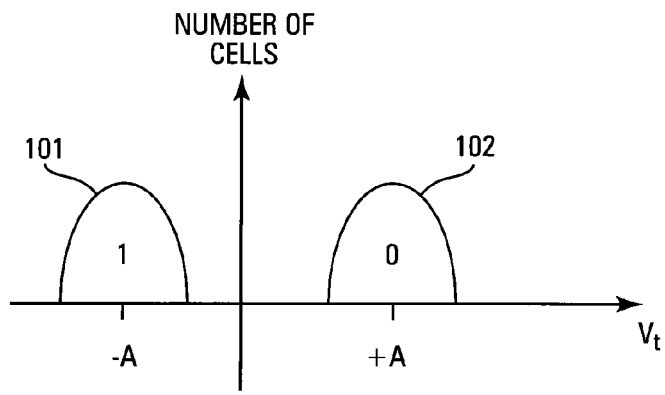
FIGS. 1A and 1B show voltage distributions for possible program states of typical non-volatile memory cells.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
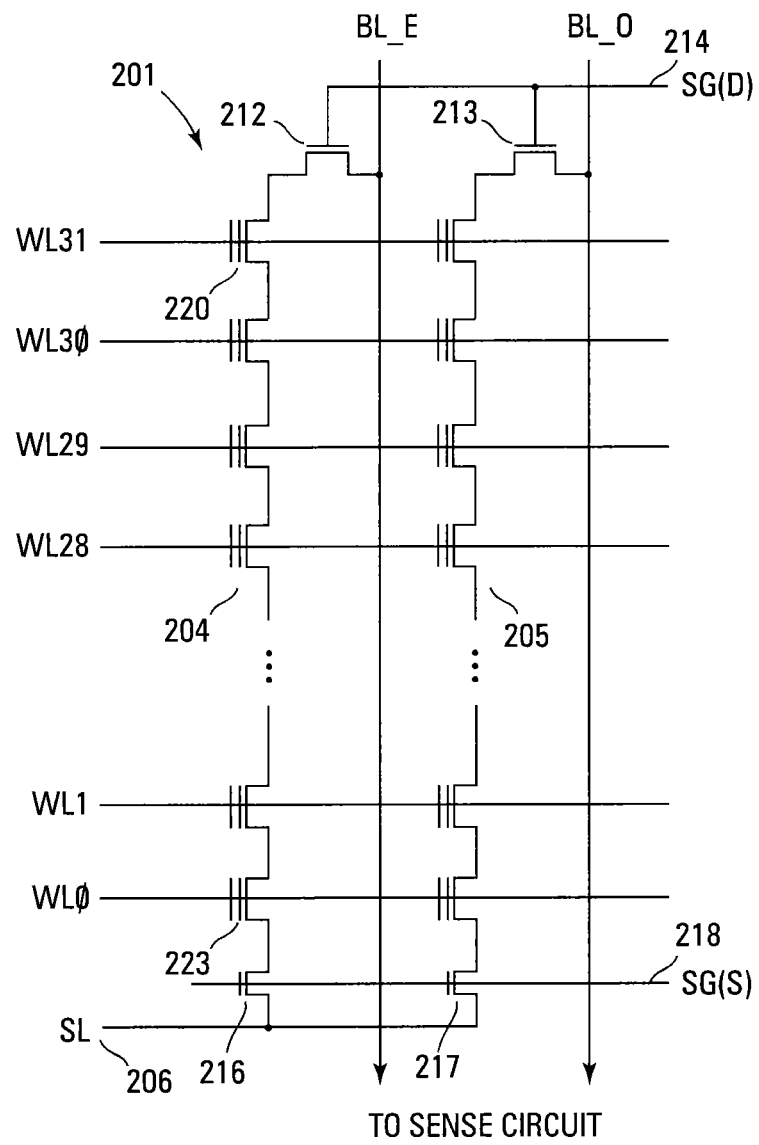
FIG. 2 shows a schematic diagram of one embodiment of a portion of a NAND architecture memory array.

FIG. 2 illustrates a schematic diagram of one embodiment of a portion of a NAND architecture memory array 201 comprising series strings of non-volatile memory cells. The schematic diagram of FIG. 2 is for purposes of illustration of one example of a programmable non-volatile memory device only. The embodiments of the method for programming are not limited to the memory array architecture illustrated. Alternate embodiments can use NOR or other architectures as well.

The memory array 201 comprises an array of non-volatile memory cells (e.g., floating gate) arranged in columns such as series strings 204, 205. Each of the cells is coupled drain to source in each series string 204, 205. An access line (e.g. word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually each bit line is coupled to a page buffer with sense circuitry that detects the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or a multiple level cell (MLC). Each cell's threshold voltage ($V_t$) is indicative of the data state that is stored in the cell. For example, in an SLC, a $V_t$ of 2.5V might indicate a programmed cell while a $V_t$ of −2.5V might indicate an erased cell. An MLC uses multiple $V_t$ ranges that each indicates a different data state. Multilevel cells can take advantage of the analog nature of a traditional flash cell by assigning a bit pattern to a specific $V_t$ range. This technology permits the storage of data states representing two or more bits per cell, depending on the quantity of $V_t$ ranges assigned to the cell. In either case, conventional memory devices typically use a program state (e.g., represented by distributions 101 and 102, or distributions 103, 104, 105, and 106) to directly represent, in a one-to-one relationship, a data state (e.g. data states 1 and 0, or data states 11, 10, 00, and 01, respectively).

Figures 3, 4:
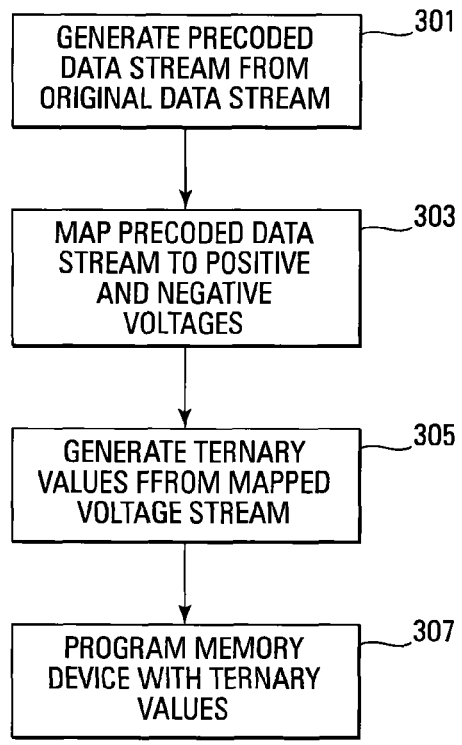
FIG. 3 shows a flowchart of one embodiment of a method for programming a memory device.
FIG. 4 shows a table of one embodiment of data and voltage streams in accordance with the method of FIG. 3.

FIG. 3 illustrates a flowchart of one embodiment of a method for programming a memory device, such as an SLC non-volatile memory device as illustrated in FIG. 2. The method starts with a data stream of bits such as illustrated as the $U_k$ data stream in FIG. 4 where 'k' is a bit position in the stream. In a typical prior art programming method, $U_k$ is the data stream that would be programmed into a memory device.

The $U_k$ data stream is used in generating a pre-coded data stream 301. The pre-coded data stream is represented in FIG. 4 as $V_k$. In one embodiment, $V_k$=XOR($U_k$, $V_{k-1}$). In one embodiment, it is assumed that $V_k$ is initialized to a logical 0.

Using the $U_k$ data stream of FIG. 4 as an example, it can be seen that since $U_0$=1 and $V_k$ is initially 0, the new $V_0$=XOR(1, 0)=1. Similarly, $U_1$=0 and $V_0$=1 thus $V_1$=1. This pre-coding algorithm continues for the entire $U_k$ data stream to generate the pre-coded $V_k$ data stream as illustrated in FIG. 4.

The pre-coded $V_k$ data stream is used to generate a mapped voltage stream $C_k$ 303 as illustrated in FIG. 4. The pre-coded $V_k$ data stream is mapped to positive and negative voltages from the binary $V_k$ data stream. In one embodiment, as illustrated in FIG. 4, the mapping rule can map a $V_k$=0 to a first voltage (e.g., 1V) and a $V_k$=1 to a second voltage (e.g., −1V). In one embodiment, the first and second voltages have the same magnitude. This mapping continues for the entire $V_k$ data stream to generate the mapped voltage stream $C_k$ as illustrated in FIG. 4.

The mapped voltage stream $C_k$ is then used to generate an encoded stream, such as the ternary voltage stream $X_k$ 305 as illustrated in FIG. 4. In one embodiment, $X_k$={$C_k$+$C_{k-1}$}. As an example, assuming the $C_k$ voltage stream in FIGS. 4, $X_0$={−1+1}={0} and $X1$={−1 −1}=−2. This ternary value conversion continues for the entire $C_k$ stream to generate the $X_k$ voltage stream as illustrated in FIG. 4.

The $X_k$ voltage stream is then used to program the memory device. Thus, instead of the prior art method for programming a memory cell to one of two program states (e.g., 1, 0), the programming embodiment of FIG. 3 programs one of at least three different program states (e.g., 0, −2, +2) into the memory cells.

In an alternate embodiment, the ternary voltages of $X_k$ can be generated from the original data stream $U_k$ in another manner. Referring to both $U_k$ and $X_k$ in FIG. 4, it can be seen that when $U_k$=0, $X_k$ is either −2 or +2 and when $U_k$=1, $X_k$=0. Additionally, it can be seen that when $X_k$ is preceded by an odd number of logical ones in $U_k$, $X_k$ is a −2. When $X_k$ is preceded by an even number of logical ones in $U_k$, $X_k$ is a +2. The encoded $X_k$ voltage stream can thus be generated from $U_k$ by replacing a first $U_k$ logical state (e.g., logical 1) with 0V and counting the number of occurrences of the first $U_k$ logical state (e.g., logical 1) that precede the present position in $X_k$ and replacing a second $U_k$ logical state (e.g., logical 0) with −2V when the quantity of the first logical states prior to the present position is odd and +2V when the quantity of the first logical state prior to the present position is even.

The $X_k$ values of 0, −2, and +2 shown in FIG. 4 are for purposes of illustration only. A generic representation of the $X_k$ values can be 0, −A, and +A where the magnitude of A can be any voltage that is programmable into a memory cell.

In one embodiment, the ternary $X_k$ values programmed into memory cells can be read using a sequence detector that relies on individual present data samples as well as past data samples (e.g., a Viterbi detector). One embodiment of such a Viterbi detector can be illustrated by the trellis state diagram of FIG. 5.

Figure 5:
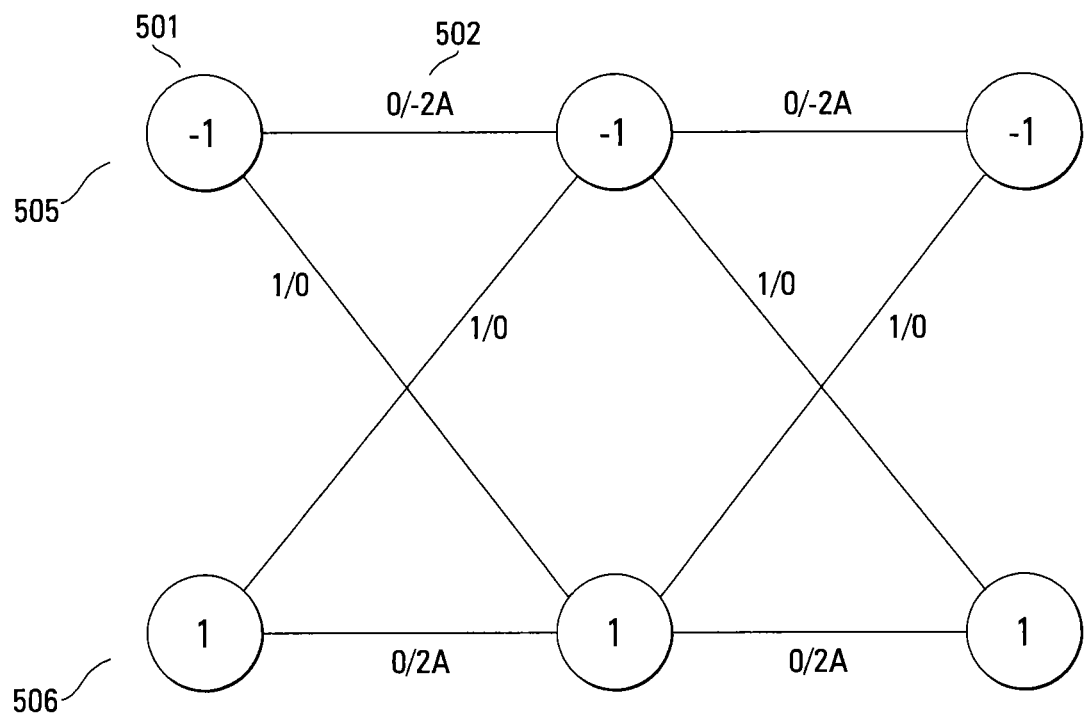
FIG. 5 shows a trellis state diagram of one embodiment of a method for reading a memory device that has been programmed with the method of FIG. 3.

The trellis state diagram of FIG. 5 illustrates the relationship between $C_k$ and $X_k$. Since $C_k$ of the embodiment of FIG. 4 shows two values (e.g., −1 and 1), the trellis is shown having two possible states (e.g., −1 and 1). Each circle 501 in the trellis represents a $C_{k-1}$ state. The lines between each $C_{k-1}$ state represent movement either to the same state (e.g., −1 to −1) or to the second state (e.g., −1 to 1). Each of these lines is labeled by the $U_k/X_k$ values 502 that trigger that movement.

An example of interpretation of the trellis state diagram refers to both the table of FIG. 4 and the trellis state diagram of FIG. 5. FIG. 4 shows that when $C_{k-1}$=−1, $U_k$=0, and $X_k$=−2 then the present state will be −1 (e.g., $C_k$=−1). This is illustrated by the top edge 505 of the trellis state diagram. Similarly, when $C_{k-1}$=1, $U_k$=0, and $X_k$=2 then the present state will be 1 (e.g., $C_k$=1). This is illustrated by the bottom edge 506 of the trellis state diagram.

The trellis state diagram of FIG. 5 also shows that when $C_{k-1}$=−1, $U_k$=1, and $X_k$=0 then the present state will be 1 (e.g., $C_k$=1). Similarly, when $C_{k-1}$=1, $U_k$=1, and $X_k$=0 then the present state will be −1 (e.g., $C_k$=−1).

Figure 1B:
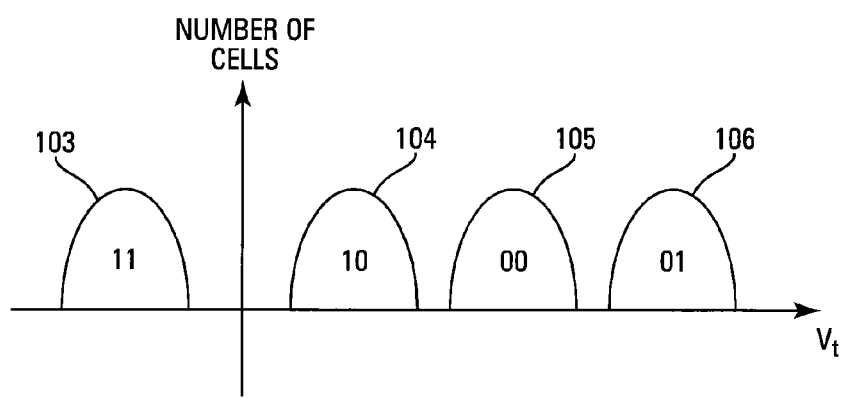

The method for programming can result in a doubling of the average energy during memory programming as compared to typical prior art programming. For example, assuming that the distributions for the two states are centered on voltages −A and +A, as shown in FIG. 1, the average signal power of a prior art programming method is $A^2$. The average signal power of $X_k$ of the present method for programming is $(½)[4A^2+0]=2A^2$ thus improving signal-to-noise ratio.

A Viterbi detector is a sequence detector. In other words, it does not make decisions about individual $U_k$ based on their individual $X_k$ outputs. Instead it relies on a sequence of past samples to make its decisions. In the following description of the Viterbi detector, $Y_k$ denotes a noisy version of $X_k$. That is, $Y_k$=$X_k$+$N_k$ where $N_k$ is the electronic noise that gets added to $X_k$ as part of the storing and retrieval process of data on non-volatile memory. At each time unit k, the Viterbi detection comprises four operations: Branch Metric Computation, Path Metric Update, Survivor Exchange, and Decision Release.

In describing the Branch Metric Computation, reference is made to the trellis state diagram of FIG. 5, each edge 505, 506 connecting a pair of states is a branch. After $Y_k$ is read from the memory, $(Y_k-X_k)^2$ is determined for each branch in that stage of the trellis. Since there are four transitions in each stage of the trellis, a trellis stage being a collection of branches connecting the states $C_{k-1}$ to state $C_k$; it describes the state of affairs at time unit k—the following four branch metrics are determined, where B1 and B2 refer to the transitions leaving State 0 and B3 and B4 refer to the transitions leaving State 1:

$B1=(Y_k+2A)^2$ $B2=(Y_k-0)^2$ $B3=(Y_k-0)^2$ $B4=(Y_k-2A)^2.$

Expanding out these quantities and discarding the noise term (Y2) from each equation results in:

$B1=4AY_k+4A^2;$ $B2=0$ $B3=0$ $B4=-4AY_k+4A^2.$

A quantity known as a state metric, also referred to as the path metric is associated with the two states. This quantity gets updated at each time unit k. To signify that fact, the two path metrics at time unit k are denoted by P(0, k) and P(1, k), respectively. The two path metrics are initialized to 0 at time unit 0. Then at every time unit k, for each of the two states, it is observed that there are two separate candidate paths: one from the state 0 and the other from state 1. The metrics of the two candidate paths that end at state 0 at time k are denoted by the notation CP1(0, k) and CP2(0, k) and are computed as:

$$CP1(0,k)=P(0,k-1)+B1$$

$$CP2(0,k)=P(1,k-1)+B3$$

It is then determined which of the above two candidates is smaller. The smallest candidate is chosen as the updated path to state 0 and subsequently referred to as the path-metric to state 0 at time k, P(0, k). The same operation is performed for state 1 to produce P(1, k−1). A comparison is then performed between CP1(1, k)=P(0, k−1)+B2 and CP2(1, k)= P(1, k−1) +B4. The smallest is then chosen as the updated path metric to state 1 at time k and subsequently denoted as P(1, k).

At the beginning of the decision process, an array of registers is assigned to each of the two states. These registers are typically known as a survivor array or simply survivor. The number of registers in each of the survivors is referred to as the path-memory. If the path-memory is 20, the survivor of state 0 is denoted by S0=S0(0), S0(1), . . . S0(19) and the survivor of state 1 by S1=S1(0), S1(1), . . . , S1(19).

In the Path Metric Update stage, once the updated path metric for a given state has been generated, the $U_k$ label on the chosen branch coming to that state is pushed into the corresponding survivor. For example, when generating the updated path-metric P(0, k) for state 0, if CP1(0, k) is chosen, the $U_k$ label is pushed on B1 branch (e.g., 0 into S0). If CP2(0, k) is chosen, the $U_k$ label is pushed on the B3 branch (e.g., 1 into S0).

Similarly, when generating the updated path-metric for state 1, P(1, k), if CP1(1, k) won, the $U_k$ label is pushed on branch B2 (e.g., 1 into S1). If CP2(1, k) won, the $U_k$ label is pushed on branch B4 (e.g., 0 into S1).

This process cannot go on beyond 20 time units if the path-memory is 20. It is limited by the length of the path-memory. At that point, the survivors are full and any new $U_k$ cannot be pushed into survivors. This is when Decision Release happens. The oldest content is pushed in the survivor S0(0) for state 0 and S1(0) for state 1 out of the survivor. Furthermore, all the remaining contents of each survivor are pushed back by one to the left to take advantage of the empty slot in S0(0) for state 0 and S1(0) for state 1. This creates room for the new in-coming $U_k$. The new $U_k$ is pushed into the 19th register S0(19) for State 0 and S1(19) for State 1. These now become the new survivors for each state.

Two pushed-out contents of the survivors are now available—one that was pushed out of S0 and another that was pushed out of S1. One of these two is chosen as the Decision and released. Apriori it is decided which survivor is desired from which to release decisions: S0 or S1. This survivor is used throughout for Decision Release. Since the first Decision Release occurs only after the survivors are full, there is a latency equaling Path Memory that, in this example, is 20. In other words, decision released at time 20 is about $U_0$, decision released at time 21 is about $U_1$, decision released at time 22 is about $U_2$, and so on.

In the prior art, decisions are made substantially instantaneously. In other words, as soon as $Y_k$ is observed, the corresponding $U_k$ is decided. The Viterbi detector makes decisions with delay, by considering the history of the paths traversed in coming to the present state. This makes it aware that certain paths are illegal and a correct sequence of $U_k$ would not have taken it. Instantaneous snapshot decisions might not be able to distinguish wrong paths from the correct paths because they ignore the path history. The Viterbi detector can thus provide an advantage of better noise immunity.

Figure 6:
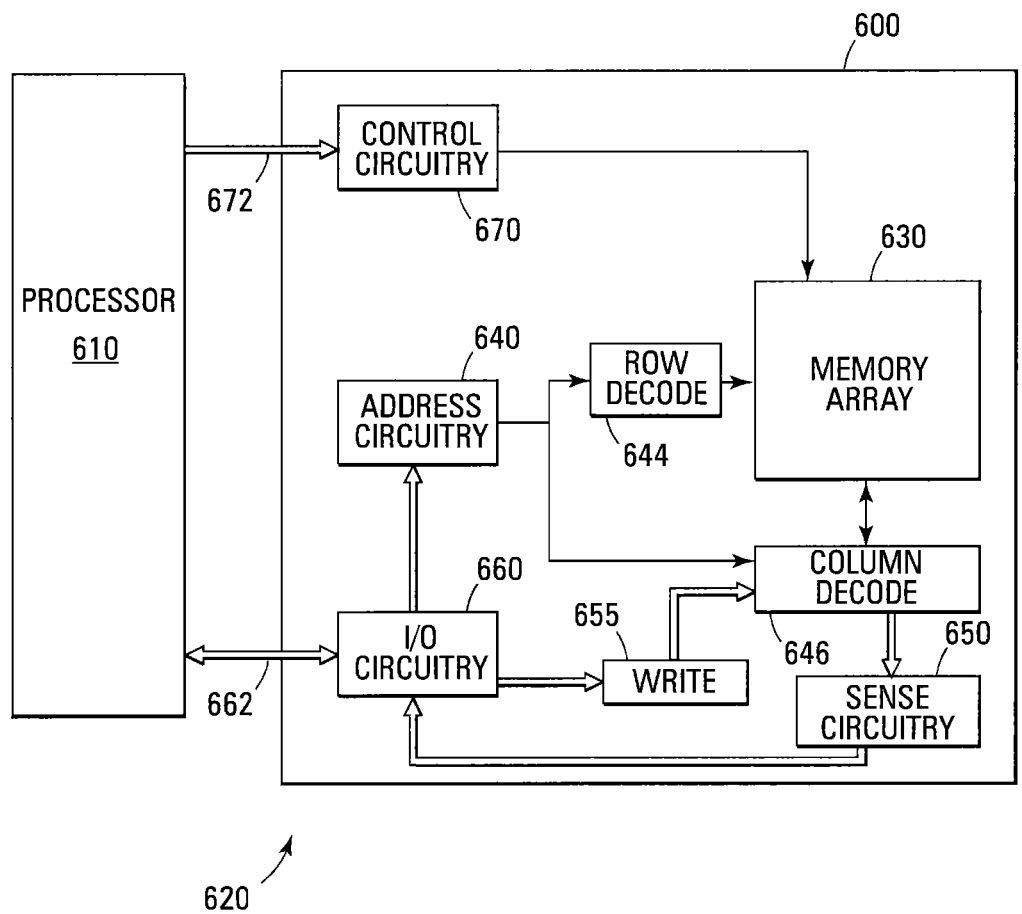
FIG. 6 shows a block diagram of one embodiment of a system that can incorporate a memory device using the described methods for sense operations.

FIG. 6 illustrates a functional block diagram of a memory device 600 that can comprise a memory array architecture such as illustrated in FIG. 2 and can be programmed using the programming methods disclosed herein. The memory device 600 is coupled to an external controller 610. The external controller 610 may be a microprocessor or some other type of controller. The memory device 600 and the external controller 610 form part of a system 620.

The memory device 600 includes an array 630 of memory cells (e.g., non-volatile memory cells). The memory array 630 is arranged in banks of word line rows and bit line columns. In one embodiment, the columns of the memory array 630 comprise series strings of memory cells.

Address buffer circuitry 640 is provided to latch address signals provided through I/O circuitry 660. Address signals are received and decoded by a row decoder 644 and a column decoder 646 to access the memory array 630.

The memory device 600 reads data in the memory array 630 by sensing voltage or current changes in the memory array columns using sense circuitry 650. The sense circuitry 650, in one embodiment, is coupled to read and latch a row of data from the memory array 630. The sense circuitry 650, as previously described, includes the sense circuitry as well as other circuits for performing a program verify operation. Data are input and output through the I/O circuitry 660 for bidirectional data communication as well as the address communication over a plurality of data connections 662 with the controller 610. Write circuitry 655 is provided to write data to the memory array.

An internal controller (e.g., control circuitry and/or firmware) 670 decodes signals provided on a control interface 672 from the external controller 610. These signals are used to control the operations on the memory array 630, including data read, data write (program), and erase operations. The internal controller 670 may be a state machine, a sequencer, or some other type of controller to generate the memory control signals. In one embodiment, the internal controller 670 is configured to control execution of the programming embodiments of the present disclosure. In an alternate embodiment, the external controller 610 is configured to control execution of the programming embodiments of the present disclosure.

The memory device illustrated in FIG. 6 has been simplified to facilitate a basic understanding of the features of the memory. A more detailed understanding of internal circuitry and functions of flash memories are known to those skilled in the art.

Conclusion

In summary, one or more embodiments of a program operation can provide improved signal-to-noise ratio in programming memory cells. This can be accomplished by encoding two original data states of an SLC memory device into at least three different program states, thus increasing the programmed signal power.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for programming memory cells, the method comprising:
   generating an encoded stream using a data stream, wherein the encoded stream comprises at least three different program states;
   wherein generating an encoded stream further comprises generating a pre-coded data stream from the data stream by logically combining a bit of the data stream with a preceding bit of the pre-coded data stream; and
   using the encoded stream to program the memory cells.

2. The method of claim 1 wherein a first program state of the at least three different program states represents a first data state of two data states and both a second and a third program state of the at least three different program states represent a second data state of the two data states.

3. The method of claim 1 wherein a first program state of the three different program states has a first voltage magnitude and both a second program state and a third program state of the three different program states have a second voltage magnitude.

4. The method of claim 3 wherein the second program state is a negative second voltage and the third program state is a positive second voltage.

5. The method of claim 1 and further comprising reading the data stream from the encoded stream with a sequence detector.

6. The method of claim 5 wherein the sequence detector is responsive to both individual current data samples and past data samples.

7. The method of claim 5 wherein the sequence detector is a Viterbi detector.

8. The method of claim 1 wherein generating an encoded stream comprises generating the encoded stream directly from the data stream.

9. A method for programming memory cells, the method comprising:
   generating an encoded stream using a data stream, wherein the encoded stream comprises at least three different program states; and
   using the encoded stream to program the memory cells, wherein generating an encoded stream comprises generating the encoded stream directly from the data stream by:
   generating a first encoded state for a present bit position of the encoded stream when a present bit position of the data stream has a first data state;
   generating a second encoded state for the present bit position of the encoded stream when the present bit position of the data stream has a second data state and when the present bit position of the data stream is preceded by an odd number of bit positions in the data stream having the first data state; and
   generating a third encoded state for the present bit position of the encoded stream when the present bit position of the data stream has the second data state and when the present bit position of the data stream is preceded by an even number of bit positions in the data stream having the first data state.

10. A method for programming memory cells, the method comprising:
    generating an encoded stream using a data stream, wherein the encoded stream comprises at least three different program states; and
    using the encoded stream to program the memory cells, wherein generating an encoded stream comprises:
    generating a pre-coded data stream from the data stream;
    generating a mapped voltage stream from the pre-coded data stream; and
    generating the encoded stream from the mapped voltage stream.

11. A method for programming memory cells, the method comprising:
    detecting a quantity of bit positions having a first data state preceding a present bit position in a data stream; and
    generating a first encoded state for a present bit position of an encoded stream when the present bit position of the data stream has a first data state;
    generating a second encoded state for the present bit position of the encoded stream when the present bit position of the data stream has a second data state and when the present bit position of the data stream is preceded by an odd number of bit positions in the data stream having the first data state; and
    generating a third encoded state for the present bit position of the encoded stream when the present bit position of the data stream has the second data state and when the present bit position of the data stream is preceded by an even number of bit positions in the data stream having the first data state.

12. The method of claim 11 wherein the second and the third encoded states correspond to voltages having a same magnitude.

13. The method of claim 11 wherein the first and second data states comprise an erased state and a programmed state.

14. A method for programming memory cells, the method comprising:
    generating a pre-coded data stream using a received data stream;
    generating a mapped voltage stream using the pre-coded data stream;
    generating a ternary voltage stream using the mapped voltage stream; and
    programming the memory cells using the ternary voltage stream.

15. The method of claim 14 wherein generating the pre-coded data stream comprises logically combining a present data value of the original data stream with a previous data value of the pre-coded data stream.

16. The method of claim 14 wherein generating the mapped voltage stream comprises mapping each data value of the pre-coded data stream to a representative voltage.

17. The method of claim 16 wherein mapping each data value of the pre-coded data stream to a representative voltage comprises mapping a first logical state of the pre-coded data stream to a first voltage and mapping a second logical state of the pre-coded data stream to a second voltage.

18. The method of claim 14 wherein the first and second voltages have a same magnitude.

19. The method of claim 14 wherein an initial preceding data value of the pre-coded data stream has been initialized to a first logical state.

20. The method of claim 14 wherein the ternary voltage stream comprises voltages of 0, a positive voltage A, and a negative voltage −A, wherein the magnitude A is a voltage that is programmable into the memory cells.

21. The method of claim 20 wherein a first data state of the data stream is represented by 0V and a second data state of the data stream is represented by both A Volts and −A Volts.

22. The method of claim 21 wherein a first bit having the second data state is represented by A Volts responsive to an odd number of bits in the data stream prior to the first bit having the first data state and a second bit having the second data state is represented by −A Volts responsive to an even number of bits in the data stream prior to the second bit having the first data state.

23. A device comprising:
an array of memory cells; and
a controller configured to:
generate an encoded stream from a data stream, wherein the encoded stream comprises at least three different program states;
generate the encoded stream by generating a pre-coded data stream from the data stream by logically combining a bit of the data stream with a preceding bit of the pre-coded data stream; and
program memory cells of the array using the encoded stream.

24. The device of claim 23 wherein the data stream comprises only first and second data states.

25. A device comprising:
an array of memory cells; and
a controller configured to:
generate an encoded stream from a data stream, wherein the encoded stream comprises at least three different program states; and
program memory cells of the array using the encoded stream;
wherein the controller is further configured to count a particular number of bits prior to a present bit in the data stream having a first data state and at least partially generate the encoded stream using the count.

26. A device comprising:
an array of memory cells; and
a controller configured to:
generate an encoded stream from a data stream, wherein the encoded stream comprises at least three different program states; and
program memory cells of the array using the encoded stream;
wherein the controller being configured to generate the encoded stream comprises the controller being configured to generate a pre-coded data stream from the data stream by logically combining a bit of the data stream with a preceding bit of the pre-coded data stream.

27. The device of claim 26 wherein the controller is further configured to map the pre-coded data stream to a voltage stream.

28. A device comprising:
an array of memory cells; and
a controller, coupled to the array of memory cells, the controller configured to control programming of the array of memory cells wherein a received data stream having two program levels is encoded into three different program levels prior to programming, wherein the controller is further configured to count a particular logic state of the received data stream and encode the three different program levels responsive to a quantity of the particular logic states prior to a present position in the data stream.

29. The device of claim 28 wherein the controller is further configured to execute a Viterbi detector to read the programmed array of memory cells.

30. The device of claim 28 wherein the controller is further configured to encode the received data stream into a ternary voltage stream comprising voltages of 0, A, and −A.

31. A device comprising:
an array of memory cells; and
a controller, coupled to the array of memory cells, the controller configured to control programming of the array of memory cells wherein a received data stream having two program levels is encoded into three different program levels prior to programming, wherein each bit of the data stream comprises one of two states and wherein the controller is further configured to map a bit of the data stream to a representative voltage responsive to a count of one of the states preceding the bit.

* * * * *